(12) United States Patent
Ferren et al.

(10) Patent No.: US 7,642,037 B2
(45) Date of Patent: Jan. 5, 2010

(54) INTEGRATED CIRCUIT LITHOGRAPHY

(75) Inventors: Bran Ferren, Beverly Hills, CA (US);
Nathan P. Myhrvold, Medina, WA (US); Lowell L. Wood, Jr., Livermore, CA (US)

(73) Assignee: Searete, LLC, Bellevue, WA (US)

( * ) Notice: Subject to any disclaimer, the term of this patent is extended or adjusted under 35 U.S.C. 154(b) by 326 days.

(21) Appl. No.: 10/927,898

(22) Filed: Aug. 27, 2004

(65) Prior Publication Data
US 2006/0046212 A1    Mar. 2, 2006

(51) Int. Cl.
*G03F 7/00* (2006.01)
*G03F 7/20* (2006.01)

(52) U.S. Cl. .............. 430/311; 430/1; 430/5; 430/396; 430/322

(58) Field of Classification Search ......... 430/311, 430/396, 1, 5
See application file for complete search history.

(56) References Cited

U.S. PATENT DOCUMENTS

| | | | |
|---|---|---|---|
| 3,677,634 A * | 7/1972 | Mathisen | 355/2 |
| 5,212,588 A * | 5/1993 | Viswanathan et al. | 359/355 |
| 5,528,364 A * | 6/1996 | Koike | 356/334 |
| 5,705,298 A * | 1/1998 | Knoedl, Jr. | 430/2 |
| 6,077,631 A | 6/2000 | Unno | |
| 6,339,471 B1 * | 1/2002 | Morita | 356/401 |
| 6,445,470 B1 * | 9/2002 | Jenkins et al. | 359/11 |
| 6,485,891 B1 | 11/2002 | Noguchi et al. | |
| 6,538,722 B2 | 3/2003 | Matsumoto et al. | |
| 6,563,564 B2 | 5/2003 | De Mol et al. | |
| 2001/0052969 A1 | 12/2001 | Bunau et al. | |
| 2002/0008911 A1 | 1/2002 | Sekine | |
| 2002/0018189 A1 | 2/2002 | Mulkens et al. | |
| 2002/0036763 A1 | 3/2002 | Krikke et al. | |
| 2004/0006757 A1 | 1/2004 | Chen et al. | |
| 2004/0119970 A1 | 6/2004 | Dusa et al. | |
| 2004/0160583 A1 | 8/2004 | Mulkens et al. | |

OTHER PUBLICATIONS

Lexel Laser: Tech Info, "How Gas-Ion Lasers Work," pp. 1-6 located at http://www.lexellaser.com/techinfo_gas-ion.htm printed on Aug. 26, 2004.
Lexel Laser: Tech Info, "Laser Wavelength Charts," pp. 1-4 located at http://www.lexellaser.com/techinfo_wavelengths.htm printed on Aug. 26, 2004.

* cited by examiner

*Primary Examiner*—Mark F Huff
*Assistant Examiner*—Caleen O Sullivan

(57) ABSTRACT

A method of generating an imaging pattern using a mask having a mathematical (e.g., Fourier-space) representation of an imaging pattern in an imaging plane. In addition to the foregoing, other method aspects are described in the claims, drawings, and text forming a part of the present application. Other methods and apparatuses are also disclosed.

20 Claims, 15 Drawing Sheets

INTEGRATED CIRCUIT LITHOGRAPHY

TECHNICAL FIELD

The present application relates, in general, to generating imaging patterns on integrated circuit substrates for lithography.

SUMMARY

One embodiment, a method of generating an imaging pattern on an integrated circuit substrate, includes orienting a mask having a mask pattern of a real-space representation of a Fourier-space representation of the imaging pattern in an imaging plane between a substantially coherent light source and the integrated circuit substrate; diffracting light with the mask according to the mask pattern to produce the imaging pattern; and exposing a photoresist on a surface of the integrated circuit substrate with the diffracted light from the mask. In addition to the foregoing, other method aspects are described in the claims, drawings, and text forming a part of the present application. In addition to the foregoing, other method aspects are described in the claims, drawings, and text forming a part of the present application.

Another embodiment, an apparatus for generating an imaging pattern on a chip, includes a mechanism for exposing a mask having a mask pattern related to a Fourier-space representation of the imaging pattern in an imaging plane with a substantially coherent light generated from a substantially coherent light source; and a mechanism for exposing a photoresist on a surface of the chip with a diffraction light diffracted from the mask in response to the substantially coherent light source, wherein the diffraction light forms the imaging pattern on the photoresist on the surface of the chip. In addition to the foregoing, other method aspects are described in the claims, drawings, and text forming a part of the present application. Mechanisms such as the herein-referenced mechanisms are typically design choices within the purview of the system designer skilled in the art.

Another embodiment, an apparatus for generating an imaging pattern on a chip, includes a substantially coherent light source that emits substantially coherent light along a light path; a diffractive mask patterned to form a real-space representation of a Fourier-space representation related to the imaging pattern in an imaging plane; a mask holder operable to hold the diffractive mask in the light path, in an orientation that produces diffracted light in an exposure field; and a chip holder operable to hold a chip in the exposure field; wherein the diffractive mask is of a type that diffracts light to form the imaging pattern on a photoresist on a surface of the chip. In addition to the foregoing, other method aspects are described in the claims, drawings, and text forming a part of the present application.

Another embodiment, a method for designing a mask pattern for generating an imaging pattern on a photoresist responsive to substantially coherent light of a selected wavelength, includes selecting a wave propagation function in a Fourier space as a function of the selected wavelength; defining a representation of the imaging pattern in real space; transforming the representation of the imaging pattern in real space to a representation of the imaging pattern in the Fourier space; dividing the representation of the imaging pattern in the Fourier space by the wave propagation function to find a representation of the mask pattern in the Fourier space; and transforming the representation of the mask pattern in the Fourier space into a representation of the mask pattern in real space. In addition to the foregoing, other method aspects are described in the claims, drawings, and text forming a part of the present application.

Another embodiment, a method of producing a selected pattern in a photomask, includes identifying an exposure wavelength; defining a representation of the selected pattern in real space; transforming the representation of the selected pattern in real space to a representation of the selected pattern in Fourier space; for a selected geometric configuration of the photomask relative to an exposure field, identifying a wave propagation function in the Fourier space as a function of the exposure wavelength; applying the wave propagation function to the representation of the selected pattern in the Fourier space to produce a mask pattern representation in the Fourier space; and transforming the representation of the mask pattern in the Fourier space into a representation of the mask pattern in real space. In addition to the foregoing, other method aspects are described in the claims, drawings, and text forming a part of the present application.

Another embodiment, a method, includes orienting a mask having a mask pattern of a real-space representation of a mathematical-space representation of an imaging pattern in an imaging plane between a substantially coherent light source and the integrated circuit substrate; diffracting light with the mask according to the mask pattern to produce the imaging pattern; and exposing a photoresist on a surface of the integrated circuit substrate with the diffracted light from the mask. In addition to the foregoing, other method aspects are described in the claims, drawings, and text forming a part of the present application.

Another embodiment, an apparatus for generating an imaging pattern on a chip, includes: a mechanism for exposing a mask having a mask pattern related to a mathematical-space representation of an imaging pattern in an imaging plane with a substantially coherent light generated from a substantially coherent light source; and a mechanism for exposing a photoresist on a surface of the chip with a diffraction light diffracted from the mask in response to the substantially coherent light source, wherein the diffraction light forms the imaging pattern on the photoresist on the surface of the chip. In addition to the foregoing, other apparatus aspects are described in the claims, drawings, and text forming a part of the present application. Mechanisms such as the herein-referenced mechanisms are typically design choices within the purview of the system designer skilled in the art.

Another embodiment, a method for designing a mask pattern for generating an imaging pattern on a photoresist responsive to substantially coherent light of a selected wavelength, includes selecting a wave propagation function in a mathematical space as a function of the selected wavelength; defining a representation of the imaging pattern in real space; transforming the representation of the imaging pattern in real space to a representation of the imaging pattern in the mathematical space; dividing the representation of the imaging pattern in the mathematical space by the wave propagation function to find a representation of the mask pattern in the mathematical space; and transforming the representation of the mask pattern in the mathematical space into a representation of the mask pattern in real space. In addition to the foregoing, other method aspects are described in the claims, drawings, and text forming a part of the present application.

Other embodiments are described in the detailed descriptions of the figures. In addition to the foregoing, various other method and/or system and/or article aspects are set forth and described in the text (e.g., claims and/or detailed description) and/or drawings of the present application.

In one or more various aspects, related systems include but are not limited to circuitry and/or programming and/or electro-mechanical components for effecting the herein-referenced method aspects; the circuitry and/or programming and/or electro-mechanical components can be virtually any combination of hardware, software, firmware, and/or electro-mechanical components configured to effect the herein-referenced method aspects depending upon the design choices of the system designer in light of the teachings herein.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the detailed description set forth herein.

BRIEF DESCRIPTION OF THE FIGURES

The use of the same symbols in different drawings typically indicates similar or identical items.

DETAILED DESCRIPTION

Figure 1:
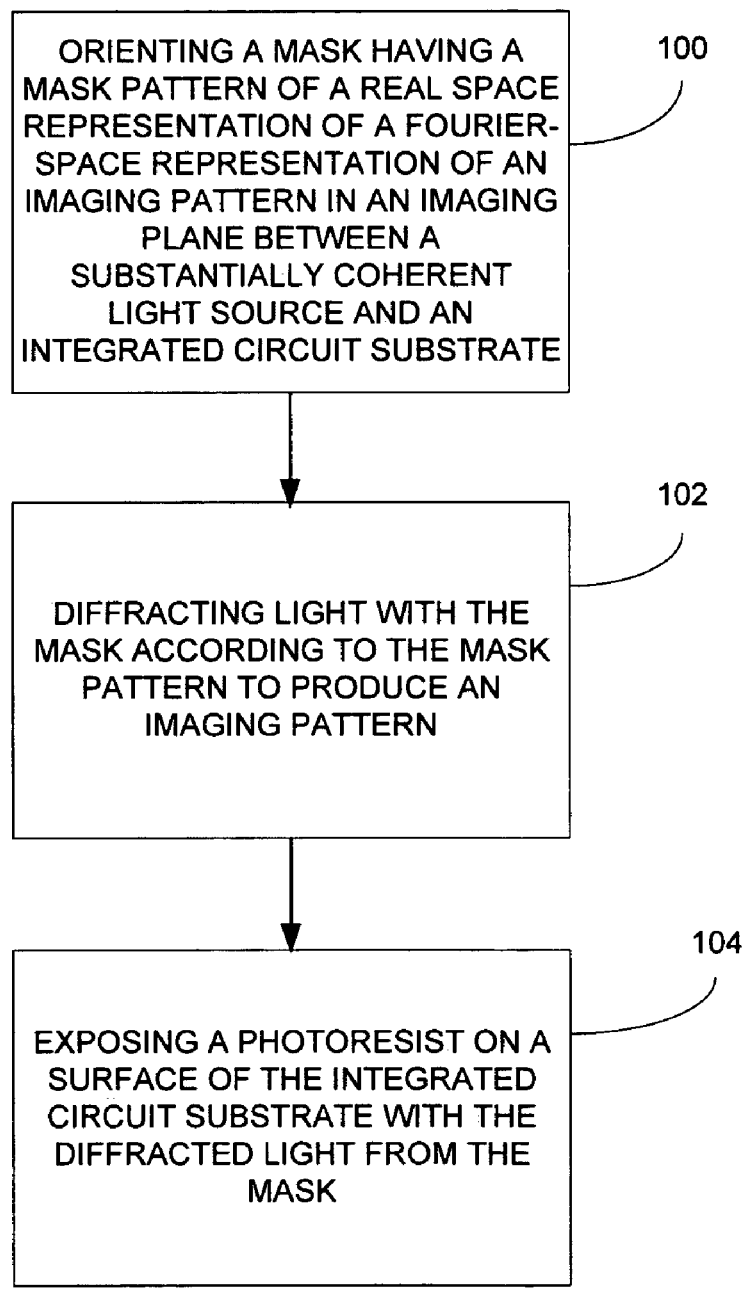
FIG. 1 is a flow chart depicting an embodiment of the subject matter of the present application.

FIG. 1 shows an embodiment of the subject matter of the present application, a method of generating an imaging pattern on an integrated circuit substrate, the method including orienting a mask having a mask pattern of a real space representation of a Fourier-space representation of the imaging pattern in an imaging plane between a substantially coherent light source and the integrated circuit substrate (step 100); diffracting light with the mask according to the mask pattern to produce the imaging pattern (step 102); and exposing a photoresist on a surface of the integrated circuit substrate with the diffracted light from the mask (step 104).

Figure 2:
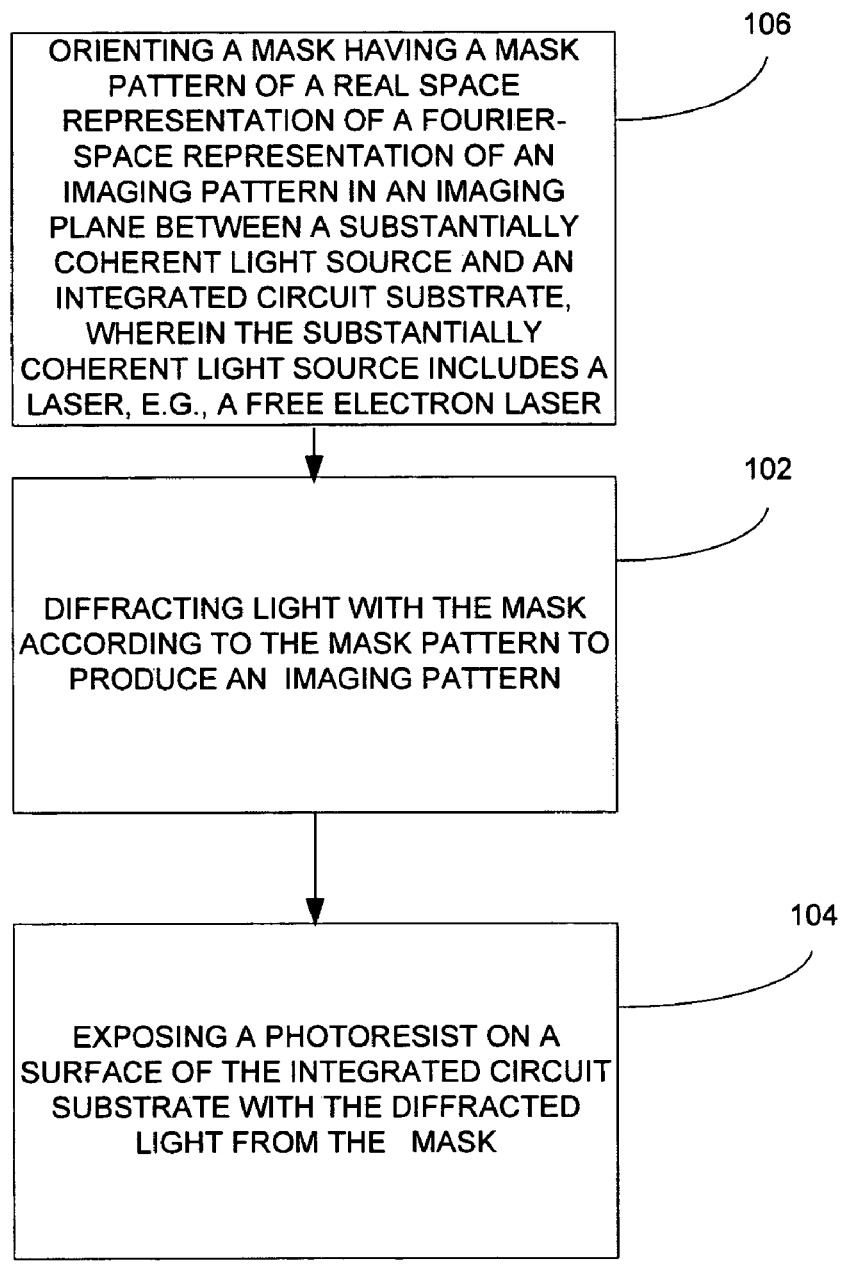
FIG. 2 is a flow chart depicting another embodiment of the subject matter of the present application.

As shown in FIG. 2, another embodiment includes step 106, orienting a mask having a mask pattern of a real space representation of a Fourier-space representation of the imaging pattern in an imaging plane between a substantially coherent light source and the integrated circuit substrate, wherein the substantially coherent light source includes a laser, e.g., a free-electron laser, and, in addition, steps 102 and 104 as described above.

Figure 3:
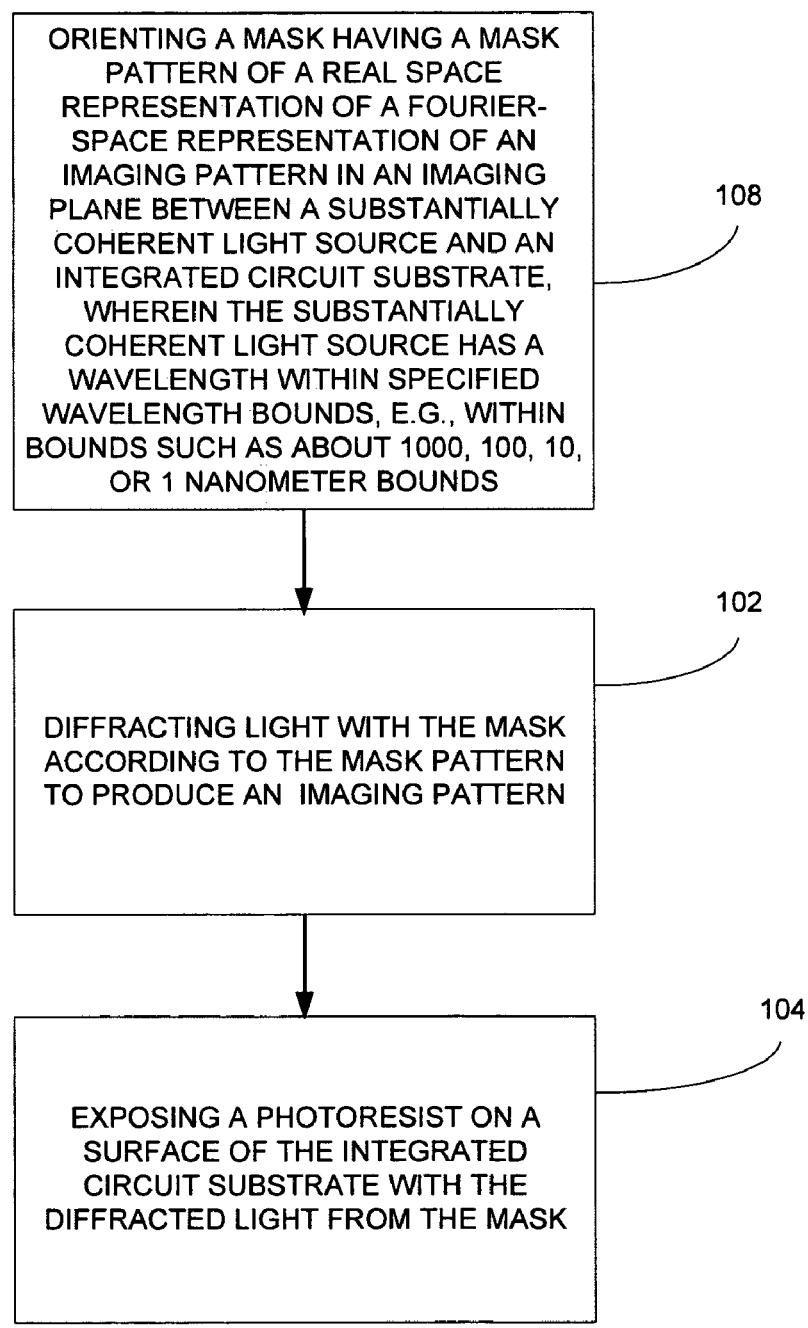
FIG. 3 is a flow chart depicting another embodiment.

FIG. 3 shows another embodiment that includes step 108, orienting a mask having a mask pattern of a real space representation of a Fourier-space representation of the imaging pattern in an imaging plane between a substantially coherent light source and the integrated circuit substrate, wherein the substantially coherent light source includes a light having wavelengths of greater than or equal to about some practicable lower-end wavelength (e.g., 1/10 nanometer lasers such as those of International Business Machines and/or around 148 nanometer lasers such as those currently readily commercially available and/or lasers having wavelengths such as those listed in the Laser Wavelength Charts of Lexel Laser appearing on the World Wide Web on Aug. 26, 2004, and/or lasers having wavelengths such as those listed in the How Gas-Ion Lasers Work article of Lexel Laser appearing on the World Wide Web on Aug. 26, 2004, and less than or equal to about some practicable upper-end wavelength (e.g., appropriately-chosen upper ends such as around 148 nanometer lasers and/or such as those that are currently readily commercially available (e.g., 148 nanometer lasers) and/or lasers having wavelengths such as those listed in the Laser Wavelength Charts of Lexel Laser appearing on the World Wide Web on Aug. 26, 2004, and/or lasers having wavelengths such as those listed in the How Gas-Ion Lasers Work article of Lexel Laser appearing onthe World Wide Web on Aug. 26, 2004, and, in addition, steps 102 and 104 as described above.

Figure 4:
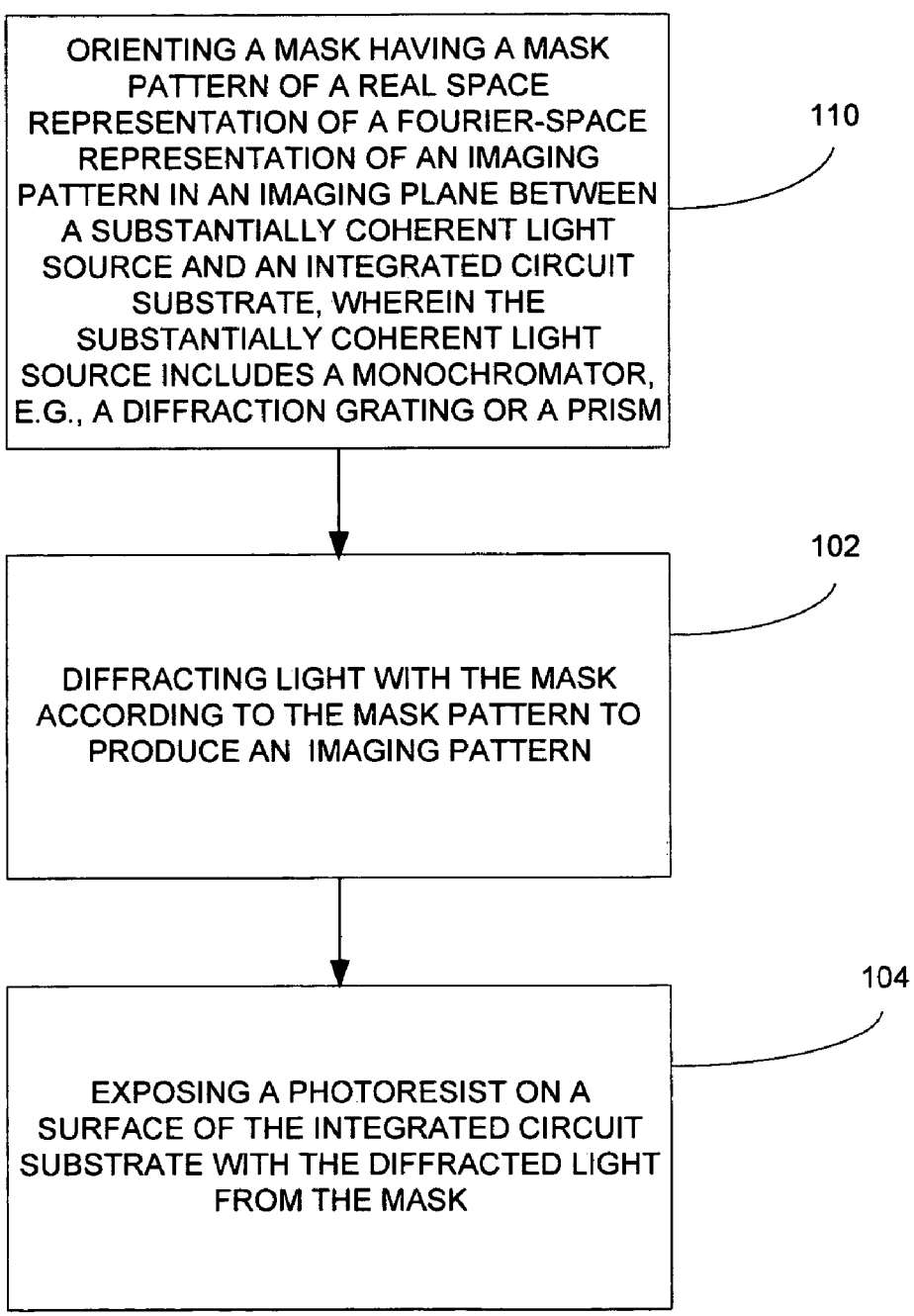
FIG. 4 is a flow chart depicting another embodiment.

As shown in FIG. 4, another embodiment includes step 110, orienting a mask having a mask pattern of a real space representation of a Fourier-space representation of the imaging pattern in an imaging plane between a substantially coherent light source and the integrated circuit substrate, wherein the substantially coherent light source includes a monochromator, e.g., a diffraction grating or a prism, and, in addition, steps 102 and 104 as described above.

Figure 5:
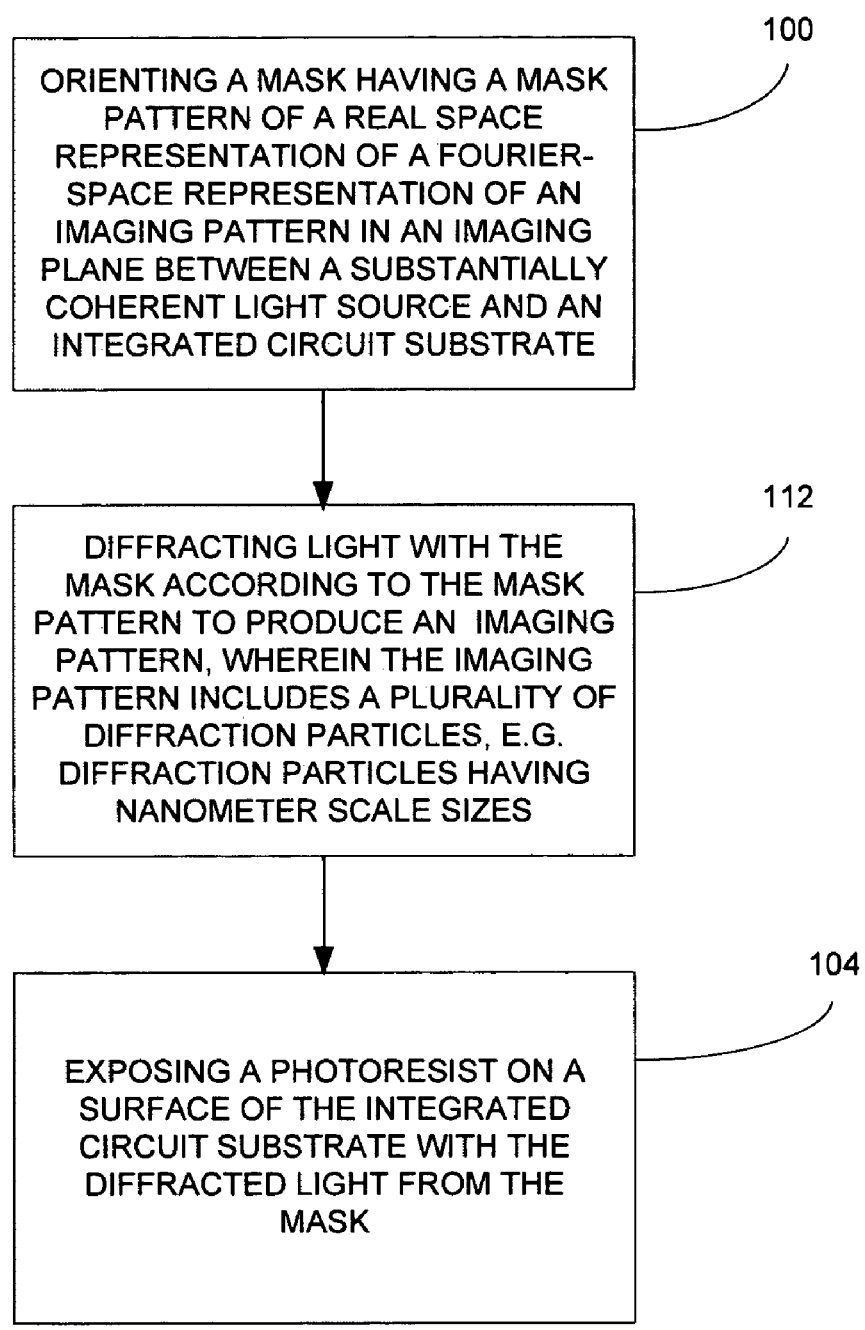
FIG. 5 is a flow chart depicting another embodiment.

FIG. 5 shows another embodiment that includes step 112, diffracting light with the mask according to the mask pattern to produce the imaging pattern, wherein the imaging pattern includes a plurality of diffraction particles, e.g., diffraction particles having nanometer scale sizes, and, in addition, steps 100 and 104 as described above.

Figure 6:
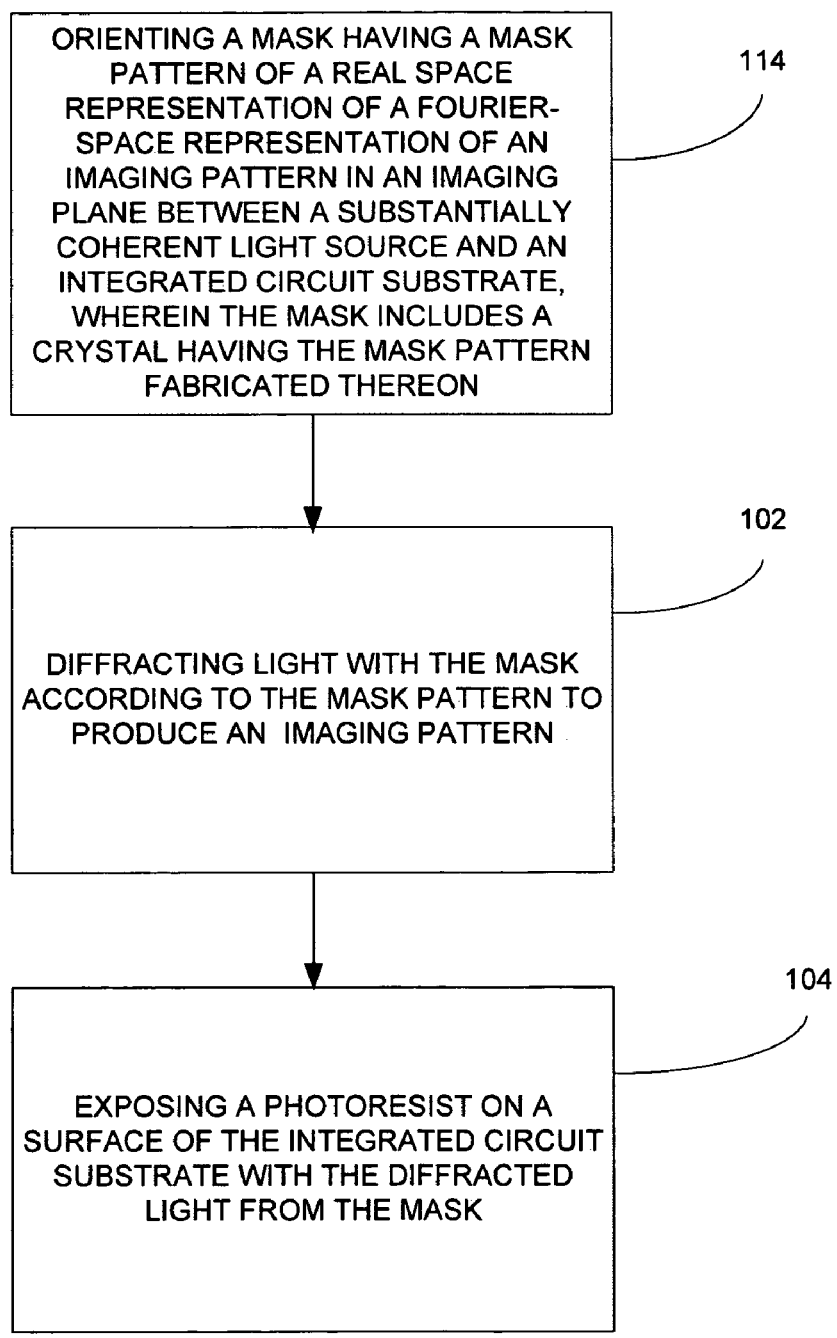
FIG. 6 is a flow chart depicting another embodiment.

FIG. 6 shows another embodiment that includes step 114, orienting a mask having a mask pattern of a real space representation of a Fourier-space representation of the imaging pattern in an imaging plane between a substantially coherent light source and the integrated circuit substrate, wherein the mask includes a crystal having the mask pattern fabricated thereon, and, in addition, steps 102 and 104 as described above.

Figure 7:
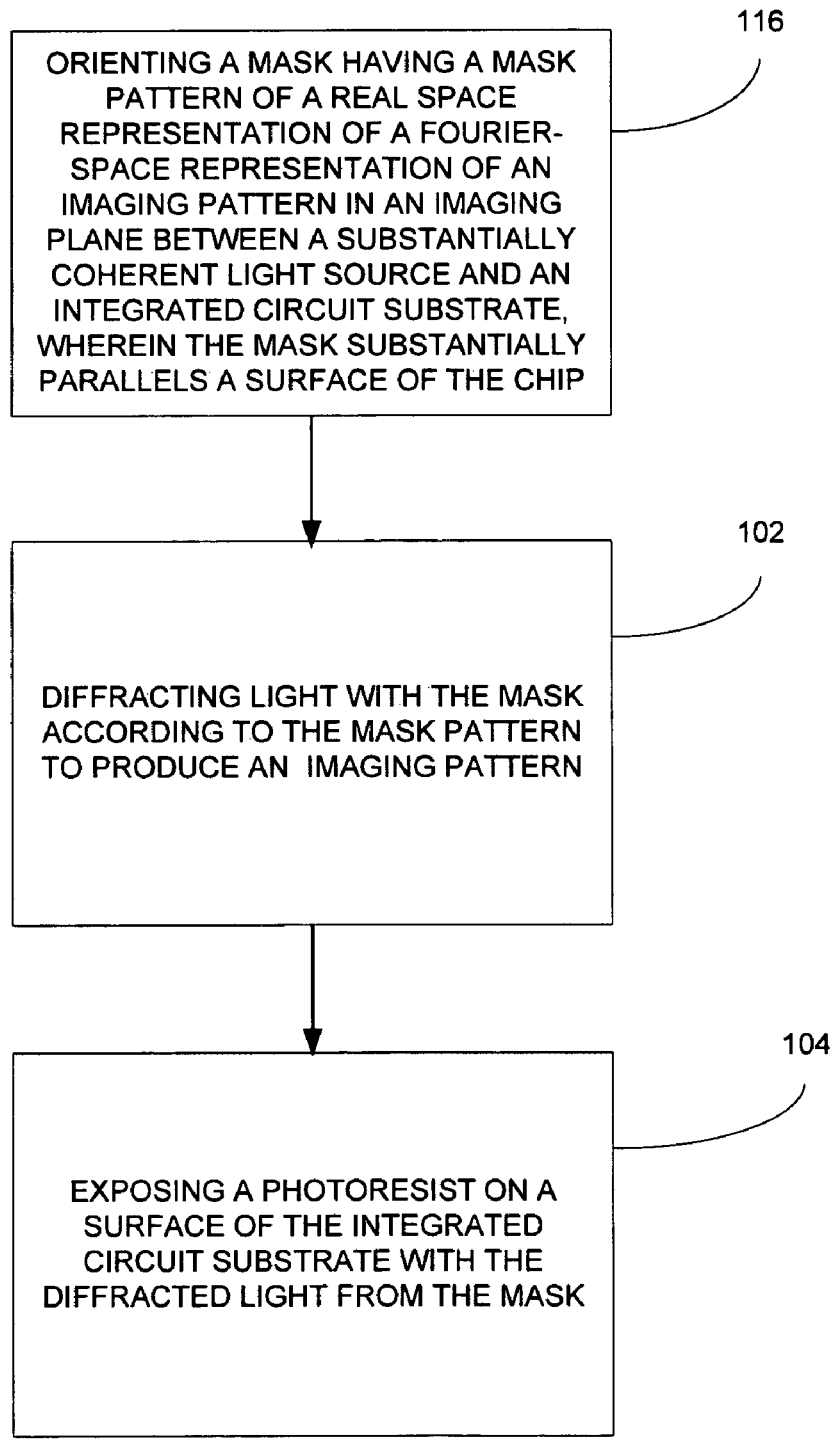
FIG. 7 is a flow chart depicting another embodiment.
Figure 8:
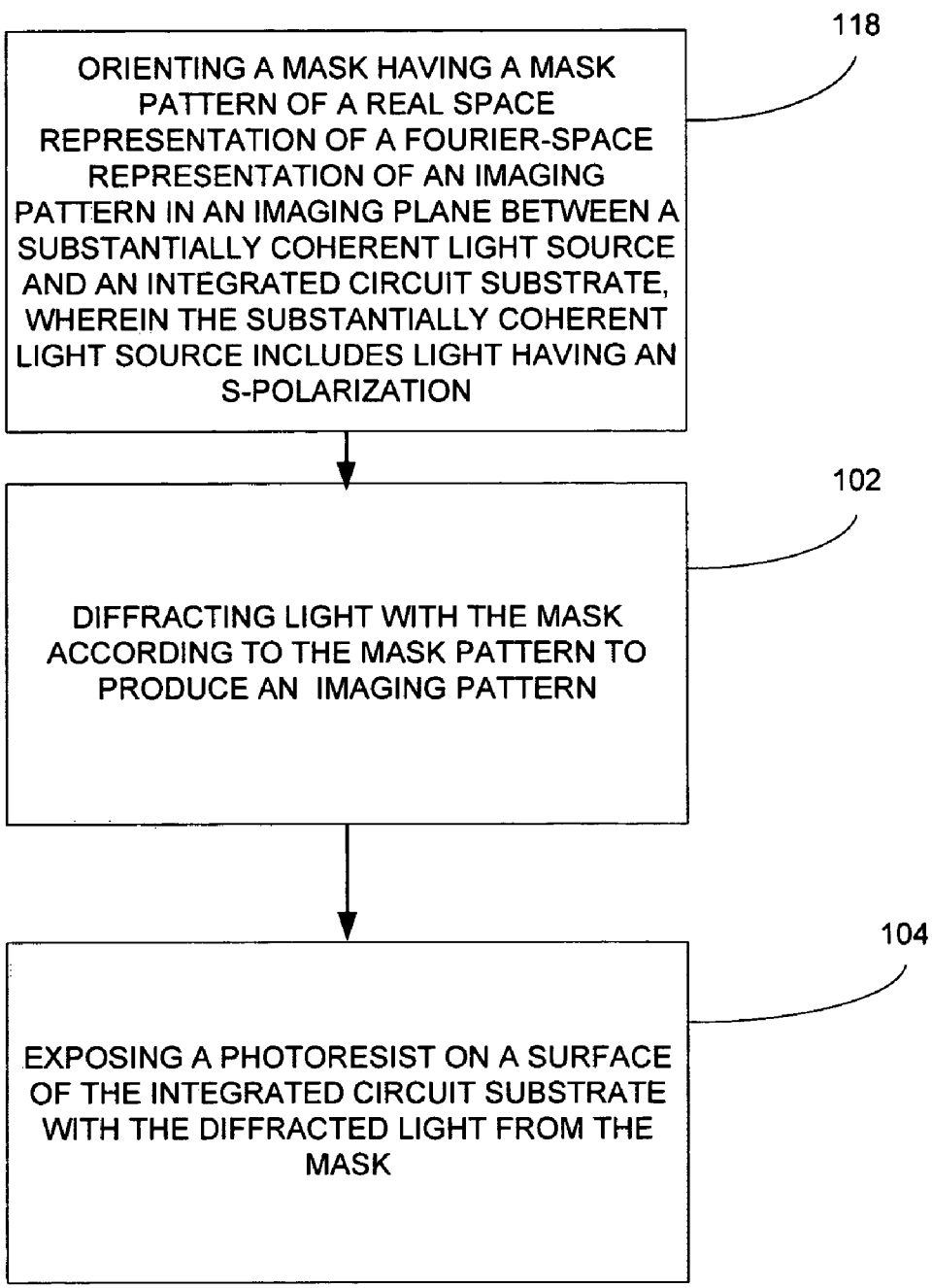
FIG. 8 is a flow chart depicting another embodiment.

As shown in FIG. 7, another embodiment includes step 116, orienting a mask having a mask pattern of a real space representation of a Fourier-space representation of the imaging pattern in an imaging plane between a substantially coherent light source and the integrated circuit substrate, wherein the mask substantially parallels a surface of the chip, and, in addition, steps 102 and 104 as described above.

As shown in FIG, 8, another embodiment includes step 118, orienting a mask having a mask pattern of a real space representation of a Fourier-space representation of the imaging pattern in an imaging plane between a substantially coherent light source and the integrated circuit substrate, wherein the substantially coherent light source includes light having an s-polarization, and, in addition, steps 102 and 104 as described above.

Figure 9:
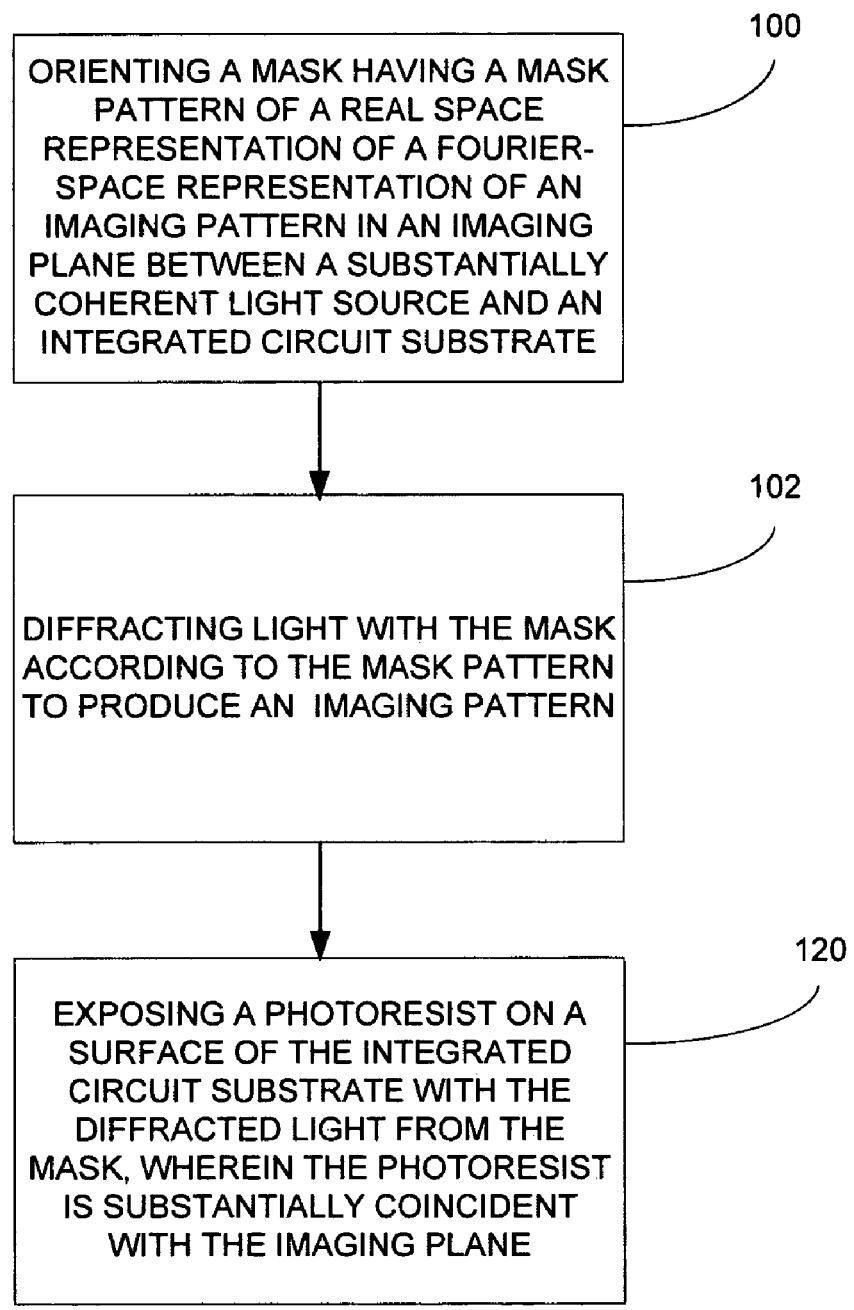
FIG. 9 is a flow chart depicting another embodiment.

As shown in FIG. 9, another embodiment includes step 120, exposing a photoresist on a surface of the integrated circuit substrate with the diffracted light from the mask, wherein the photoresist is substantially coincident with the imaging plane, and, in addition, steps 100 and 102 as described above.

Figure 10:
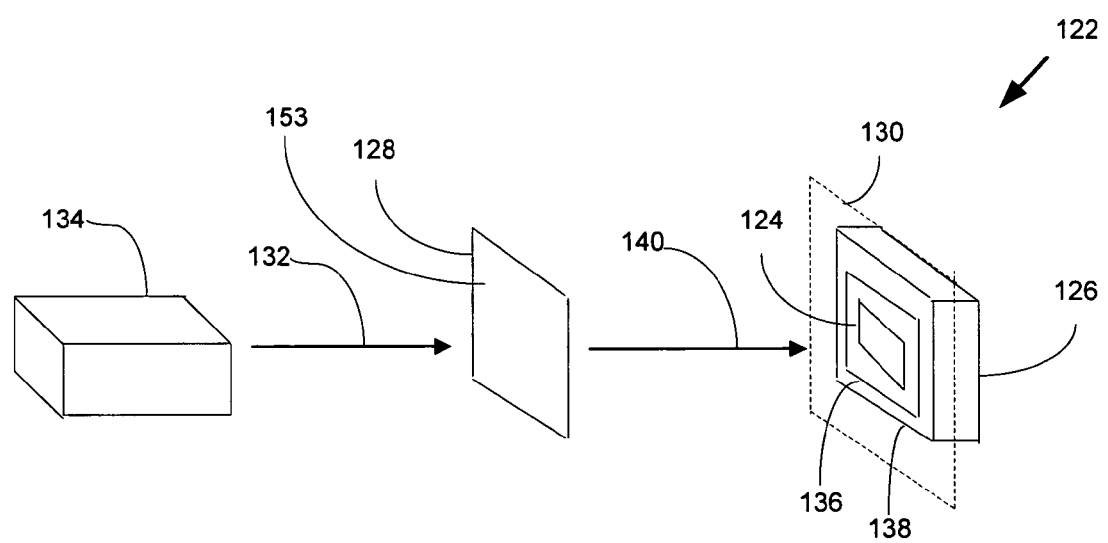
FIG. 10 is a block diagram of another embodiment.

FIG. 10 shows another embodiment, an apparatus 122 for generating an imaging pattern 124 on a chip 126, the apparatus 122 including a mechanism for exposing a mask 128 having a mask pattern related to a Fourier-space representation of the imaging pattern 124 in an imaging plane 130 with a substantially coherent light 132 generated from a substantially coherent light source 134; and a mechanism for exposing a photoresist 136 on a surface 138 of the chip 126 with a diffraction light 140 diffracted from the mask 128 in response to the substantially coherent light source 134; wherein the diffraction light 140 forms the imaging pattern 124 on the photoresist 136 on the surface 138 of the chip 126. Mechanisms such as the herein-referenced mechanisms are typically design choices within the purview of the system designer skilled in the art.

Figure 11:
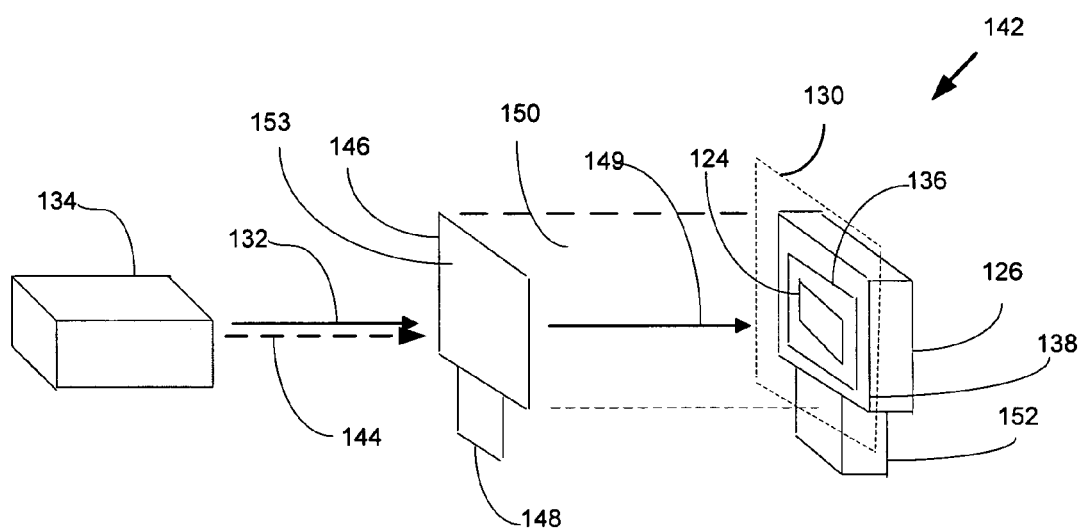
FIG. 11 is a block diagram of another embodiment.

As shown in FIG. 11, another embodiment, an apparatus 142 for generating an imaging pattern 124 on a chip 126, includes a substantially coherent light source 134 that emits substantially coherent light 132 along a light path 144; a diffractive mask 146, the diffractive mask 146 being patterned to form a real-space representation of a Fourier-space representation related to the imaging pattern 124 in an imaging plane 130; a mask holder 148 operable to hold the diffractive mask 146 in the light path 144, in an orientation that produces diffracted light 149 in an exposure field 150; and a chip holder 152 operable to hold the chip 126 in the exposure field 150; wherein the diffractive mask 146 is of a type that diffracts light to form the imaging pattern 124 on a photoresist 136 on a surface 138 of the chip 126.

With regard to the embodiments depicted in FIGS. 10 and 11, the substantially coherent light source 134 may include a laser, e.g., a free electron laser. The substantially coherent light source 134 may include light having one or more wavelengths within practicable upper and/or lower bounds such as, for example, bounds discussed elsewhere herein (e.g., in relation to FIG. 3 and/or in the as-filed claims). The substantially coherent light source 134 may include a monochromator, e.g., a diffraction grating or a prism. The imaging pattern 124 may include a plurality of diffraction particles, e.g., diffraction particles having sizes within nanometer ranges. The mask 128 and the diffractive mask 146 may include a crystal having the imaging pattern 124 fabricated thereon. A surface 153 of the mask 128 or of the diffractive mask 146 may substantially parallel the surface 138 of the chip 126. The substantially coherent light source 134 may emit substantially coherent light 132 having an s-polarization. The photoresist 136 may substantially coincide with the imaging plane.

Figure 12:
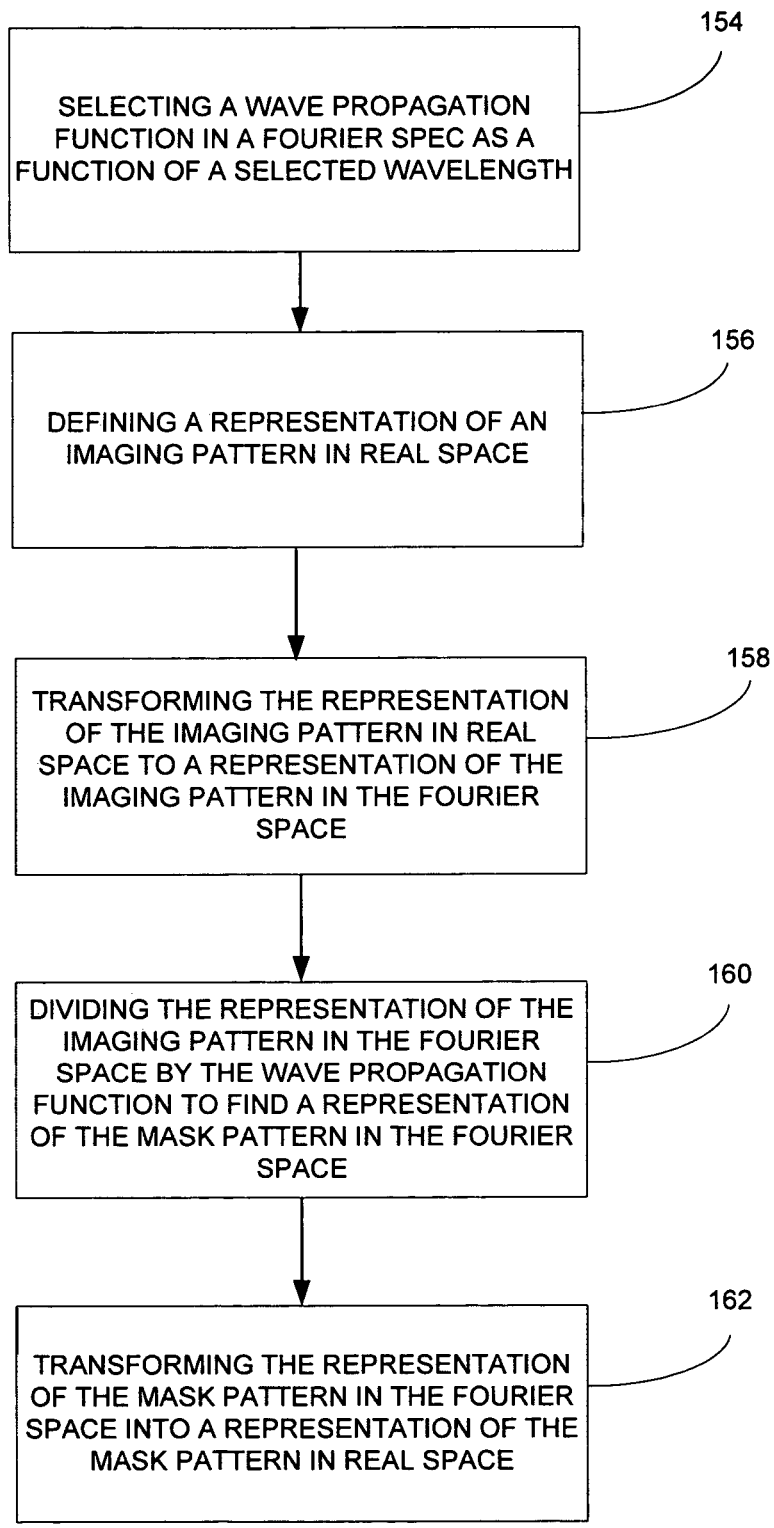
FIG. 12 is a flow chart depicting another embodiment.

FIG. 12 depicts another embodiment, a method for designing a mask pattern for generating an imaging pattern on a photoresist responsive to substantially coherent light of a selected wavelength, the method including selecting a wave propagation function in a Fourier space as a function of the selected wavelength (step 154); defining a representation of the imaging pattern in real space (step 156); transforming the representation of the imaging pattern in real space to a representation of the imaging pattern in the Fourier space (step 158); dividing the representation of the imaging pattern in the Fourier space by the wave propagation function to find a representation of the mask pattern in the Fourier space (step 160); and transforming the representation of the mask pattern in the Fourier space into a representation of the mask pattern in real space (step 162).

Figure 13:
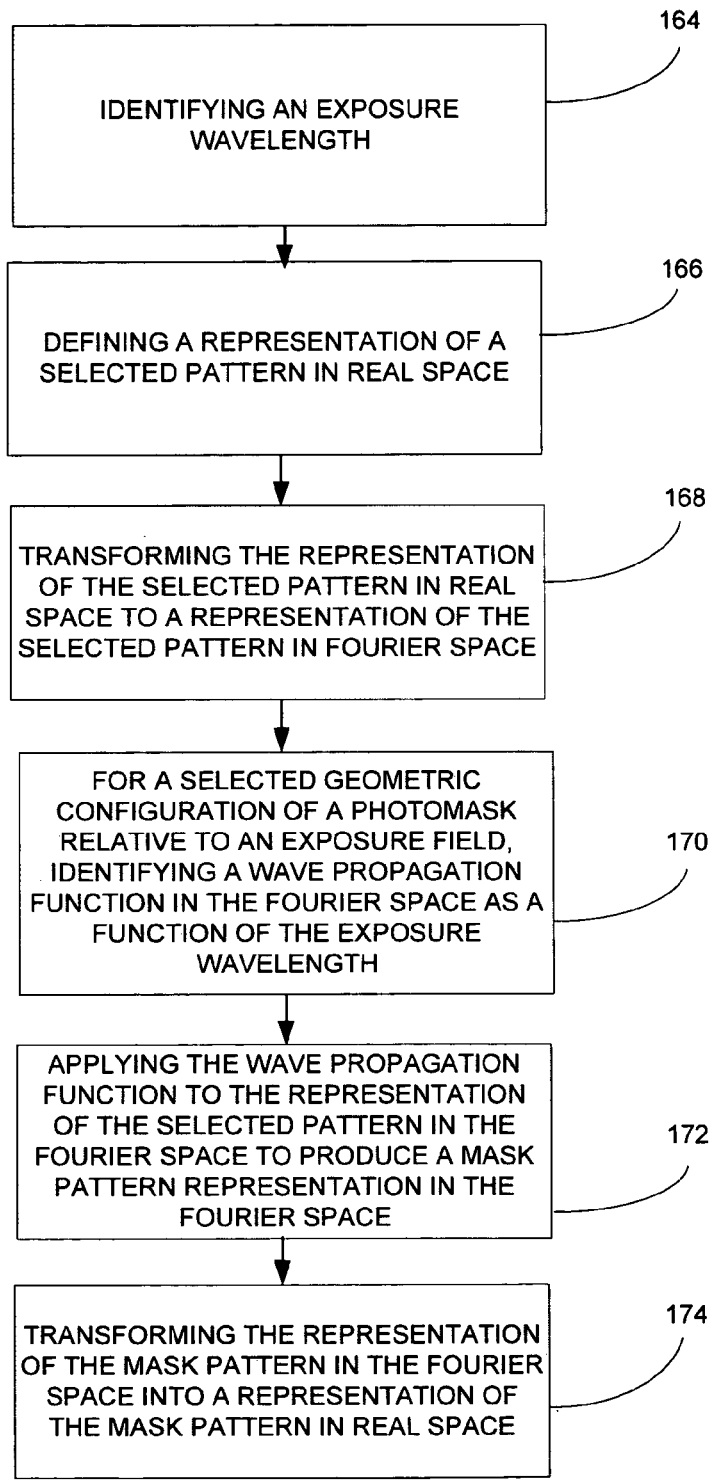
FIG. 13 is a flow chart depicting another embodiment.

As shown in FIG. 13, another embodiment, a method of producing a selected pattern in a photomask, includes identifying an exposure wavelength (step 164); defining a representation of the selected pattern in real space (step 166); transforming the representation of the selected pattern in real space to a representation of the selected pattern in Fourier space (step 168); for a selected geometric configuration of the photomask relative to an exposure field, identifying a wave propagation function in the Fourier space as a function of the exposure wavelength (step 170); applying the wave propagation function to the representation of the selected pattern in the Fourier space to produce a mask pattern representation in the Fourier space (step 172); and transforming the representation of the mask pattern in the Fourier space into a representation of the mask pattern in real space (step 174).

Figure 14:
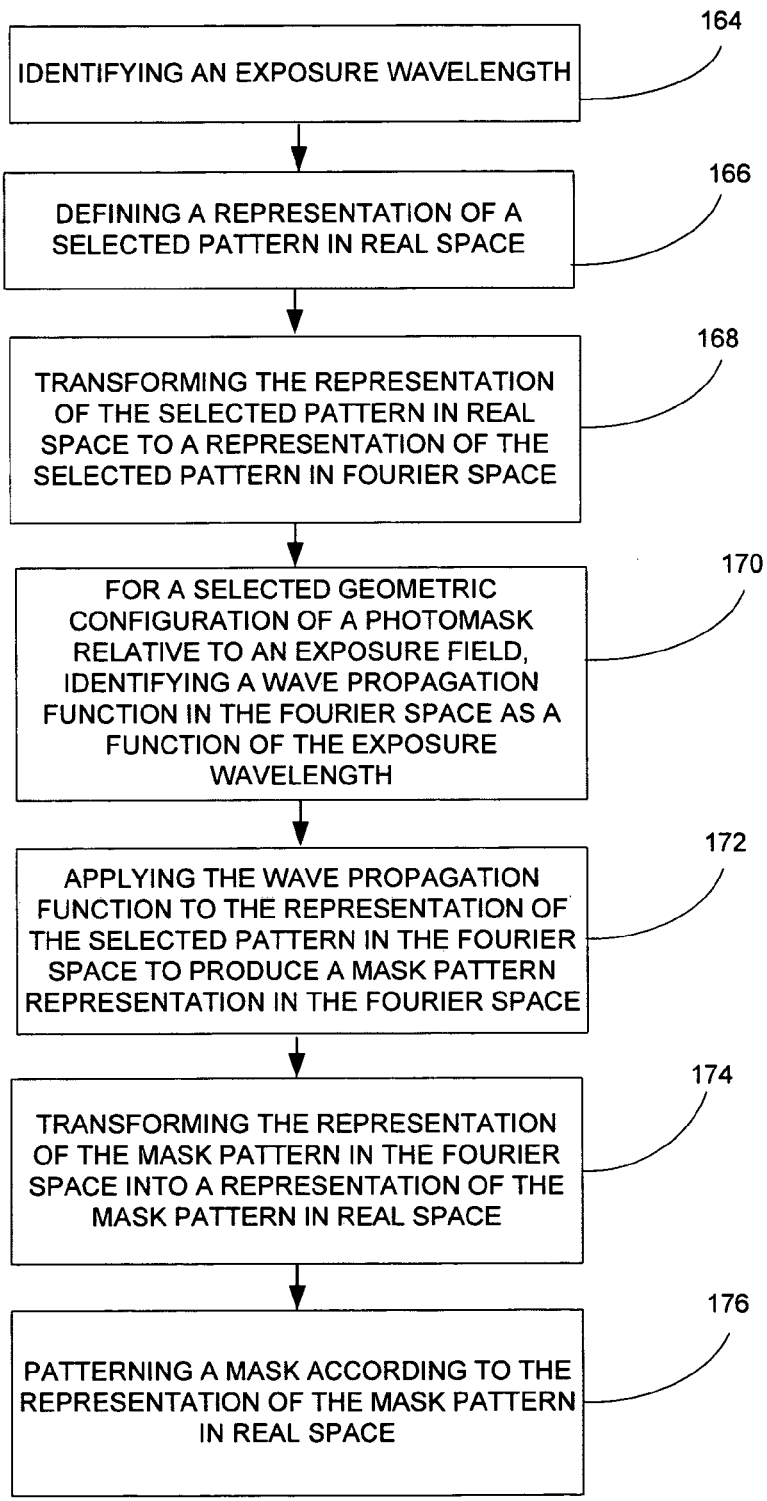
FIG. 14 is a flow chart depicting another embodiment.

FIG. 14 depicts another embodiment, a method of producing a selected pattern in a photomask, including steps 164, 166, 168, 170, 172 and 174 as described above, and, in addition, step 176, patterning a mask according to the representation of the mask pattern in real space.

Figure 15:
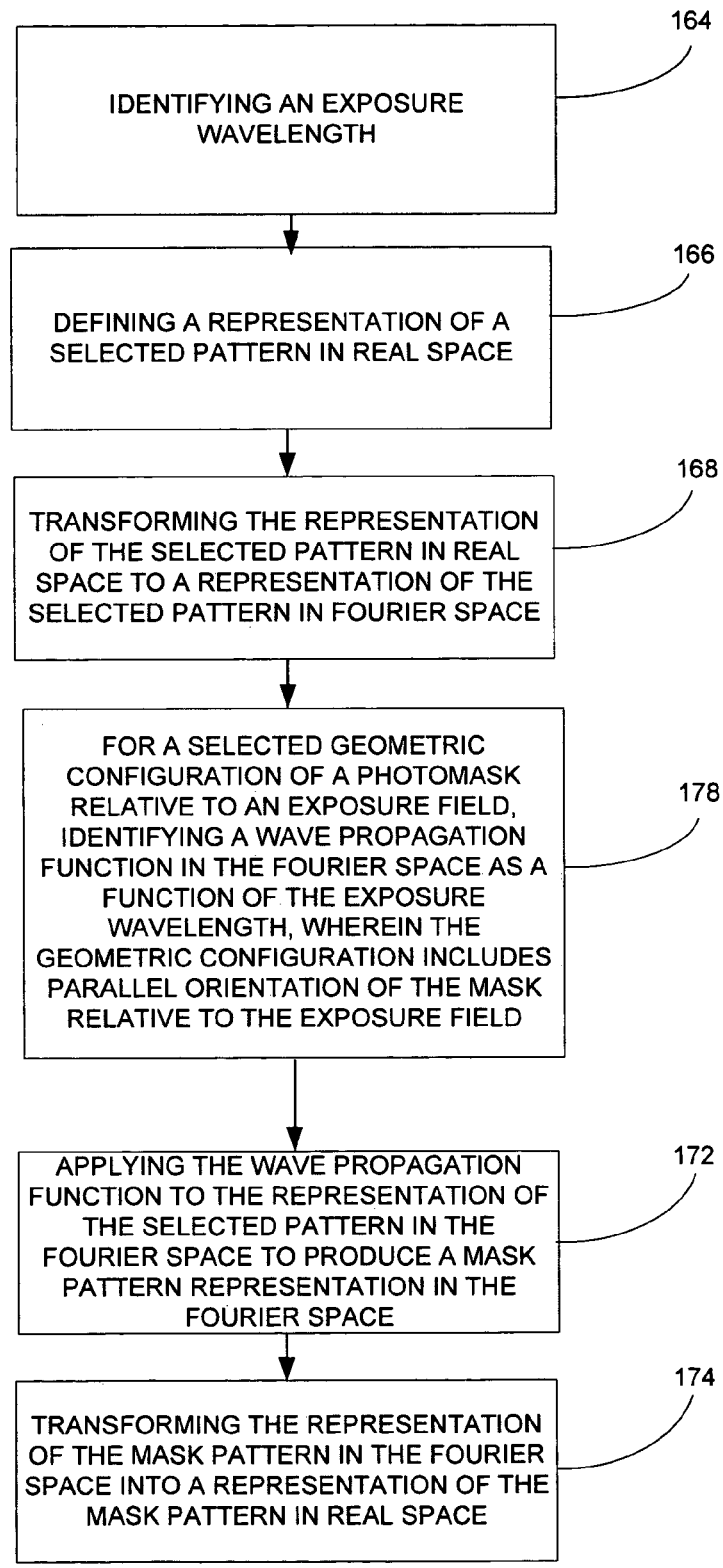
FIG. 15 is a flow chart depicting another embodiment.

FIG. 15 depicts another embodiment, a method of producing a selected pattern in a photomask, including steps 164, 166, 168, 172, and 174 as described above, and, in addition, step 178, for a selected geometric configuration of the photomask relative to an exposure field, identifying a wave propagation function in the Fourier space as a function of the exposure wavelength, wherein the geometric configuration includes parallel orientation of the mask relative to the exposure field.

One skilled in the art will recognize that the foregoing components (e.g., steps), devices, and objects in FIGS. 1-15 and the discussion accompanying them are used as examples for the sake of conceptual clarity and that various configuration modifications are common. Consequently, as used herein, the specific exemplars set forth in FIGS. 1-15 and the accompanying discussion are intended to be representative of their more general classes. In general, use of any specific exemplar herein is also intended to be representative of its class, and the non-inclusion of such specific components (e.g., steps), devices, and objects herein should not be taken as indicating that limitation is desired.

Those skilled in the art will appreciate that the foregoing specific exemplary processes and/or devices and/or technologies are representative of more general processes and/or devices and/or technologies taught elsewhere herein, such as in the claims filed herewith and/or elsewhere in the present application.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will require optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter subject matter described herein are capable of being distributed as a program product in a variety of forms, and that an illustrative embodiment of the subject matter subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein can be implemented, individually and/or collectively, by various types of electro-mechanical systems having a wide range of electrical components such as hardware, software, firmware, or virtually any combination thereof; and a wide range of components that may impart mechanical force or motion such as rigid bodies, spring or torsional bodies, hydraulics, and electro-magnetically actuated devices, or virtually any combination thereof. Consequently, as used herein "electro-mechanical system" includes, but is not limited to, electrical circuitry operably coupled with a transducer (e.g., an actuator, a motor, a piezoelectric crystal, etc.), electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), electrical circuitry forming a communications device (e.g., a modem, communications switch, or optical-electrical equipment), and any non-electrical analog thereto, such as optical or other analogs. Those skilled in the art will also appreciate that examples of electro-mechanical systems include but are not limited to a variety of consumer electronics systems, as well as other systems such as motorized transport systems, factory automation systems, security systems, and communication/computing systems. Those skilled in the art will recognize that electro-mechanical as used herein is not necessarily limited to a system that has both electrical and mechanical actuation except as context may dictate otherwise.

In a general sense, those skilled in the art will recognize that the various aspects described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and electrical circuitry forming a communications device (e.g., a modem, communications switch, or optical-electrical equipment).

The herein described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components.

All of the above U.S. patents, U.S. patent application publications, U.S. patent applications, foreign patents, foreign patent applications and non-patent publications referred to in this specification and/or listed in any Application Data Sheet, are incorporated herein by reference, in their entireties.

While particular aspects of the present subject matter described herein have been shown and described, it will be apparent to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

Other embodiments are within the following claims.

We claim:

1. A method of generating an imaging pattern on an integrated circuit substrate comprising:
   orienting a mask having a mask pattern of a real-space representation of a Fourier-space representation of the imaging pattern in an imaging plane between a substantially coherent light source and the integrated circuit substrate;
   diffracting light with the mask according to the mask pattern to produce the imaging pattern; and
   exposing a photoresist on a surface of the integrated circuit substrate with the diffracted light from the mask without providing a reference beam that cooperates with the diffracted light.

2. The method of claim 1, further comprising:
   selecting a wave propagation function in a Fourier space as a function of a selected wavelength;
   computing the Fourier-space representation of the imaging pattern in real space using a computing device;
   computationally dividing the Fourier-space representation of the imaging pattern by the wave propagation function to find a digital representation of the mask pattern in the Fourier-space;
   computationally transforming the Fourier-space representation of the mask pattern into a representation of the mask pattern in real space; and
   forming the mask having the mask pattern using the representation of the mask pattern in real space.

3. The method of claim 1 wherein the substantially coherent light source includes at least one of a laser or a free electron laser.

4. The method of claim 1 wherein the substantially coherent light source includes a light having a wavelength of greater than about 148 nanometers and less than about 1000 nanometers.

5. The method of claim 1 wherein the substantially coherent light source includes a light having a wavelength of greater than about $\frac{1}{10}$ (0.10) nanometers and less than about 148 nanometers.

6. The method of claim 1 wherein the substantially coherent light source includes a light having a wavelength of greater than about $\frac{1}{10}$ (0.10) nanometers and less than about 10 nanometers.

7. The method of claim 1 wherein the mask includes a single crystal having the mask pattern fabricated thereon.

8. The method of claim 1 wherein the substantially coherent light source includes a monochromator.

9. The method of claim 8 wherein the monochromator includes at least one of a diffraction grating or a prism.

10. The method of claim 1 wherein exposing a photoresist on a surface of the integrated circuit substrate with the diffracted light from the mask without providing a reference beam that cooperates with the diffracted light includes
    exposing a photoresist on a surface of the integrated circuit substrate with the diffracted light from the mask without providing a reference beam superimposed with the diffracted light.

11. The method of claim 1 wherein the imaging pattern includes a plurality of diffraction particles.

12. The method of claim 11 wherein the plurality of diffraction particles includes diffraction particles having nanometer scale sizes.

13. The method of claim 1 wherein a surface of the mask substantially parallels a surface of the integrated circuit substrate.

14. The method of claim 1 wherein the substantially coherent light source includes light having an s-polarization.

15. The method of claim 1 wherein the photoresist is substantially coincident with the imaging plane.

16. A method for designing a mask pattern for generating an imaging pattern on a photoresist responsive to substantially coherent light of a selected wavelength, comprising:
    selecting a wave propagation function in a Fourier space as a function of the selected wavelength;
    defining a representation of the imaging pattern in real space;
    computationally transforming the representation of the imaging pattern in real space to a representation of the imaging pattern in the Fourier space using a computing device, including computationally transforming the representation of the imaging pattern in real space to the representation of the imaging pattern in Fourier space such that a light diffracted by the representation of the imaging pattern in Fourier space produces the representation of the imaging pattern in real space without providing a reference light that cooperatively interferes with the diffracted light;
    computationally dividing the representation of the imaging pattern in the Fourier space by the wave propagation function to find a representation of the mask pattern in the Fourier space; and computationally transforming the representation of the mask pattern in the Fourier space into a representation of the mask pattern in real space.

17. A method of producing a selected pattern in a photomask, comprising:
    identifying an exposure wavelength;
    defining a representation of the selected pattern in real space;
    computationally transforming the representation of the selected pattern in real space to a representation of the selected pattern in Fourier space;
    for a selected geometric configuration of the photomask relative to an exposure field, identifying a wave propagation function in the Fourier space as a function of the exposure wavelength;
    computationally applying the wave propagation function to the representation of the selected pattern in the Fourier space to produce a mask pattern representation in the Fourier space; and
    computationally transforming the representation of the mask pattern in the Fourier space into a representation of the mask pattern in real space, including computationally transforming the representation of the selected pattern in real space to a representation of the selected pattern in Fourier space such that a light diffracted by the representation of the selected pattern in Fourier space produces the representation of the selected pattern in real space without providing a reference light that cooperatively interferes with the diffracted light.

18. The method of claim 17 further including patterning a mask according to the representation of the mask pattern in real space.

19. A method, comprising:
    computationally generating a real-space representation of a mathematical-space representation of an imaging pattern, including computationally generating the real-space representation of the mathematical-space representation such that a light diffracted by the mathematical-space representation produces the real-space representation without providing a reference light that cooperatively interferes with the diffracted light;
    forming a mask pattern of the real-space representation of the mathematical-space representation of the imaging pattern on a mask;
    orienting the mask having the mask pattern of the real-space representation of the mathematical-space representation of the imaging pattern in an imaging plane between a substantially coherent light source and the integrated circuit substrate;
    diffracting light with the mask according to the mask pattern to produce the imaging pattern; and
    exposing a photoresist on a surface of the integrated circuit substrate with the diffracted light from the mask without providing a reference beam that cooperates with the diffracted light from the mask.

20. A method for designing a mask pattern for generating an imaging pattern on a photoresist responsive to substantially coherent light of a selected wavelength, comprising:
    selecting a wave propagation function in a mathematical space as a function of the selected wavelength;
    defining a representation of the imaging pattern in real space;
    computationally transforming the representation of the imaging pattern in real space to a representation of the imaging pattern in the mathematical space using a computing device, including computationally transforming the representation of the imaging pattern in real space to the representation of the imaging pattern in mathematical space such that a light diffracted by the representation of the imaging pattern in mathematical space produces the representation of the imaging pattern in real space without providing a reference light that cooperatively interferes with the diffracted light;
    computationally dividing the representation of the imaging pattern in the mathematical space by the wave propagation function to find a representation of the mask pattern in the mathematical space; and
    computationally transforming the representation of the mask pattern in the mathematical space into a representation of the mask pattern in real space.

* * * * *

UNITED STATES PATENT AND TRADEMARK OFFICE
CERTIFICATE OF CORRECTION

PATENT NO.      : 7,642,037 B2                      Page 1 of 1
APPLICATION NO. : 10/927898
DATED           : January 5, 2010
INVENTOR(S)     : Ferren et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 676 days.

Signed and Sealed this

Sixteenth Day of November, 2010

David J. Kappos
*Director of the United States Patent and Trademark Office*